United States Patent
Kim et al.

(10) Patent No.: US 12,258,494 B2
(45) Date of Patent: Mar. 25, 2025

(54) ADHESIVE FOR PELLICLE, PELLICLE FOR PHOTO MASK AND METHOD FOR MANUFACTURING THE SAME

(71) Applicant: SAMSUNG ELECTRONICS CO., LTD., Suwon-si (KR)

(72) Inventors: Mun Ja Kim, Hwaseong-si (KR); Changyoung Jeong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/236,515

(22) Filed: Aug. 22, 2023

(65) Prior Publication Data

US 2023/0399552 A1 Dec. 14, 2023

Related U.S. Application Data

(63) Continuation of application No. 16/364,847, filed on Mar. 26, 2019, now abandoned.

(30) Foreign Application Priority Data

Jun. 26, 2018 (KR) .................. 10-2018-0073625

(51) Int. Cl.
*C09J 129/04* (2006.01)
*C08K 3/36* (2006.01)
*C08K 5/13* (2006.01)
*C09J 11/04* (2006.01)
*C09J 11/06* (2006.01)
*C09J 179/02* (2006.01)
*G03F 1/64* (2012.01)

(52) U.S. Cl.
CPC ............. *C09J 129/04* (2013.01); *C09J 11/04* (2013.01); *C09J 11/06* (2013.01); *C09J 179/02* (2013.01); *G03F 1/64* (2013.01); *C08K 3/36* (2013.01); *C08K 5/13* (2013.01)

(58) Field of Classification Search
CPC . C09J 129/04; C09J 11/04; C09J 11/06; C09J 179/02; G03F 1/64; C08K 3/36; C08K 5/13
See application file for complete search history.

(56) References Cited

U.S. PATENT DOCUMENTS

| 8,067,132 | B2 | 11/2011 | Takushima et al. |
| 8,659,157 | B2 | 2/2014 | Kimura et al. |
| 8,808,865 | B2 | 8/2014 | Kondo |

(Continued)

FOREIGN PATENT DOCUMENTS

| CN | 101075086 A | 11/2007 |
| CN | 105045035 A | 11/2015 |

(Continued)

OTHER PUBLICATIONS

English machine translation of WO-2018003572-A1 (Jan. 2018) (Year: 2018).*
English machine translation of WO-2018062835-A1 (Apr. 2018) (Year: 2018).*

(Continued)

*Primary Examiner* — Sean M DeGuire
*Assistant Examiner* — Jayson D Cosgrove
(74) *Attorney, Agent, or Firm* — Muir Patent Law, PLLC

(57) ABSTRACT

An adhesive for a pellicle, the adhesive including a phenol compound, the phenol compound having at least two hydroxyl groups, a polymer having a hydroxyl group or an amine group, and water.

18 Claims, 2 Drawing Sheets

(56) References Cited

U.S. PATENT DOCUMENTS

| | | |
|---|---|---|
| 8,956,788 B2 | 2/2015 | Nagata |
| 9,360,749 B2 | 6/2016 | Lin et al. |
| 9,433,699 B2 | 9/2016 | Lee et al. |
| 11,001,683 B2 | 5/2021 | Hwang et al. |
| 2003/0175507 A1* | 9/2003 | Ikeda ........................ C09J 7/35 |
| | | 428/343 |
| 2003/0193041 A1 | 10/2003 | Semen |
| 2011/0152394 A1 | 6/2011 | Pyun et al. |
| 2013/0052379 A1 | 2/2013 | Huang et al. |
| 2016/0349610 A1 | 12/2016 | Hsu et al. |
| 2017/0031073 A1 | 2/2017 | Nam et al. |
| 2017/0184956 A1 | 6/2017 | Kohmura et al. |
| 2018/0011397 A1 | 1/2018 | Yanase et al. |
| 2018/0046071 A1* | 2/2018 | Kohmura .................. G03F 1/62 |

FOREIGN PATENT DOCUMENTS

| | | | | |
|---|---|---|---|---|
| CN | 105542683 A | 5/2016 | | |
| JP | 2001-293820 A | 10/2001 | | |
| JP | 4047754 B2 | 11/2007 | | |
| KR | 10-2013-0011354 A | 1/2013 | | |
| KR | 10-2018-0035153 A | 4/2018 | | |
| WO | WO 2013/077476 A1 | 5/2013 | | |
| WO | WO 2018/003572 A2 | 1/2018 | | |
| WO | WO-2018003572 A1 * | 1/2018 | ............ C09J 121/02 |
| WO | WO-2018062835 A1 * | 4/2018 | ......... C08G 73/0206 |

OTHER PUBLICATIONS

Chinese Office action issued Dec. 31, 2021 for corresponding Chinese Patent Application No. 201910478848.8.
Korean Office action dated Jun. 15, 2022.

* cited by examiner

ADHESIVE FOR PELLICLE, PELLICLE FOR PHOTO MASK AND METHOD FOR MANUFACTURING THE SAME

CROSS-REFERENCE TO RELATED APPLICATION

This is a continuation of U.S. patent application Ser. No. 16/364,847 filed Mar. 26, 2019, which is incorporated by reference herein in its entirety.

Korean Patent Application No. 10-2018-0073625, filed on Jun. 26, 2018 in the Korean Intellectual Property Office (KIPO), and entitled: "Adhesive for Pellicle, Pellicle for Photo Mask and Method for Manufacturing the Same," is incorporated by reference herein in its entirety.

BACKGROUND

1. Field

Embodiments relate to an adhesive for a pellicle, a pellicle for a photo mask, and a method for manufacturing the pellicle.

2. Description of the Related Art

In order to manufacture an electronic device such as a semiconductor device, a photolithography process may be used. A photo mask and a pellicle for protecting the photo mask may be used for performing the photolithography process.

SUMMARY

Embodiments are directed to an adhesive for a pellicle, the adhesive including a phenol compound, the phenol compound having at least two hydroxyl groups, a polymer having a hydroxyl group or an amine group, and water.

Embodiments are also directed to a pellicle for protecting a photo mask, the pellicle including a pellicle membrane that is transparent, a frame supporting the pellicle membrane, and a membrane adhesive layer combining the pellicle membrane with the frame. The membrane adhesive layer may include a cross-linked structure formed from an adhesive for a pellicle according to an embodiment.

Embodiments are also directed to a method for manufacturing a pellicle for a photo mask, the method including providing an adhesive for a pellicle according to an embodiment on a surface of a frame to form a coating layer, bringing a pellicle membrane into contact with the coating layer, and drying the coating layer to form a membrane adhesive layer including a cross-linked structure.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
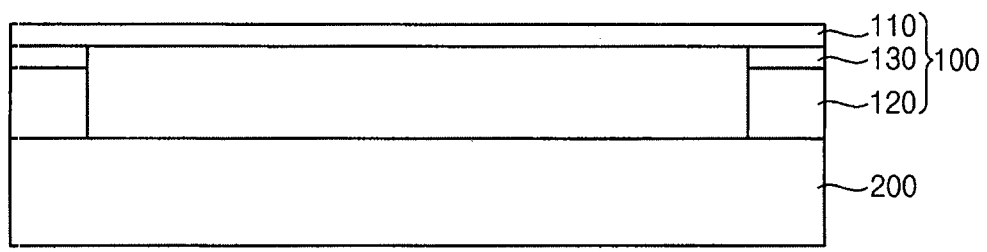
FIG. 1 is a cross-sectional view illustrating a pellicle according to an example embodiment.

Various example embodiments will be described more fully hereinafter with reference to the accompanying drawings. Embodiments may, however, be embodied in different forms and are not limited to the example embodiments illustrated and set forth herein.

Adhesive for a Pellicle

In a first example embodiment, an adhesive for a pellicle may include a phenol compound having at least two hydroxyl groups, a polymer having a hydroxyl group, and water.

For example, the adhesive may include a phenol compound having at least two hydroxyl groups, polyvinylalcohol, and water.

For example, the phenol compound may include gallic acid, glucogallin, di-galloylglucose, tri-galloylglucose, tetra-galloylglucose, m-trigallic acid, tannic acid, ellagic acid, or the like. These may be used each alone or in a combination thereof.

In an example embodiment, the phenol compound may include tannic acid. Tannic acid may be obtained from nature, and has a relatively large molecular size and includes a plurality of hydroxyl groups. Thus, tannic acid may easily form hydrogen bonds and attraction or entanglement.

Tannic acid is represented by Chemical Formula 1:

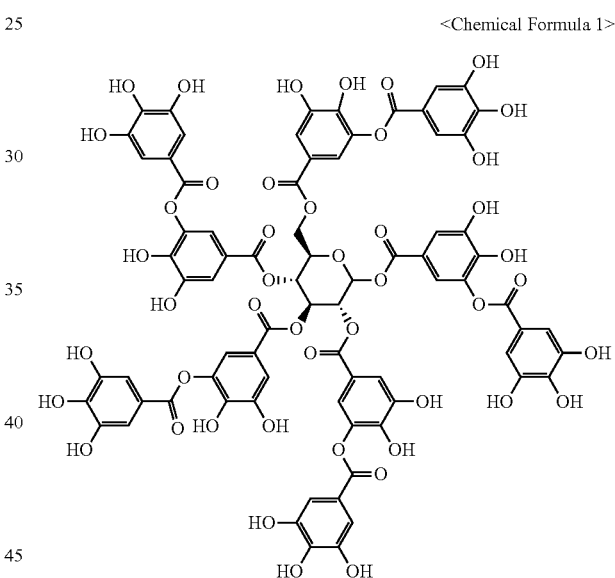

<Chemical Formula 1>

The phenol compound and the polyvinyl alcohol may respectively include a plurality of hydroxyl groups thereby forming a plurality of hydrogen bonds. Thus, the adhesive may have a large adhesive force by attraction or entanglement of the phenol compound and the polyvinyl alcohol.

In an example embodiment, the polyvinylalcohol may have a weight average molecular weight about 8,000 or more, which may provide a desired level of adhesive force while avoiding an undue increase in viscosity. For example, the molecular weight of the polyvinylalcohol may be about 8,000 to about 70,000. The polyvinylalcohol may be, for example, entirely hydrated, or may be a copolymer partially including a repeating unit of vinyl acetate.

The adhesive may further include silica particles for adjusting a curing (drying) speed. The silica particles may have a size of, for example, several nm to tens of μm. The silica particles may help increase an amount of oxygen provided in a coating layer formed from the adhesive. Thus, a cross-linking speed may be increased, and a uniform reaction across a surface portion and an inner portion may be induced. The silica particles may have, for example, a solid structure, a porous structure, a hollow structure, an aerogel structure, or the like.

In an example embodiment, the adhesive may include 1% to 30% by weight of the phenol compound, 1% to 40% by weight of the polyvinylalcohol, and a remainder of water. In another example embodiment, the adhesive may include 1% to 30% by weight of the phenol compound, 1% to 40% by weight of the polyvinylalcohol, 0.05% to 1% by weight of the silica particle, and a remainder of water. In another example embodiment, the adhesive may include 1% to 15% by weight of the phenol compound, 20% to 40% by weight of the polyvinylalcohol, 0.05% to 1% by weight of the silica particle, and a remainder of water.

When the amount of the polyvinylalcohol is excessively low, an adhesive force of the adhesive may not be sufficient. When the amount of the polyvinylalcohol is excessively high, a viscosity of the adhesive may excessively increase.

When the amount of the silica particles is excessively low, a curing speed may be reduced, and curing reaction may be irregular. When the amount of the silica particles is excessively high, an adhesive force may be reduced.

In an example embodiment, an adhesive for a pellicle includes a polyphenol compound containing a hydroxyl group, a polymer containing a hydroxyl group or an amine group, and water.

In another example embodiment, the adhesive may include a phenol compound having at least two hydroxyl groups, a polymer having an amine group, and water.

For example, the adhesive may include pyrogallol, polyethylene imine, and water.

Pyrogallol is represented by the Chemical Formula 2.

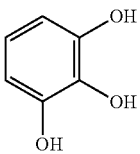

<Chemical Formula 2>

The polyethylene imine may be represented by, for example, Chemical Formula 3, in which n represents a natural number (n is not zero).

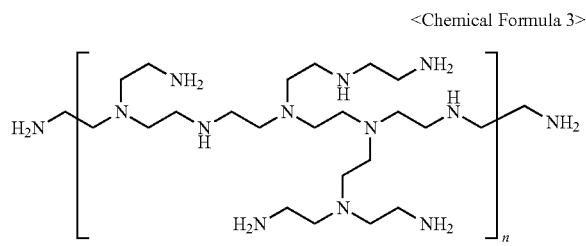

<Chemical Formula 3>

The pyrogallol and the polyethylene imine may react with each other to form a catecholamine compound having a catechol group and an amine group. For example, the pyrogallol may be changed to hydroxybenzoquinone by oxidation. The hydroxybenzoquinone may react with an amine group of the polyethylene imine to form the catecholamine compound having a catechol group and an amine group. The hydroxybenzoquinone may sequentially react with the polyethylene imine to form a cross-link. Furthermore, the catecholamine compound formed by reaction of the hydroxybenzoquinone and the polyethylene imine may form a strong hydrogen bond. Thus, a strong cross-linked structure may be formed. Therefore, the adhesive may provide a strong adhesive force.

In an example embodiment, the adhesive may include 0.01 M to 0.2 M of pyrogallol, 1% to 20% by weight of the polyethylene imine, and a remainder of water. In another example embodiment, the adhesive may include 0.01 M to 0.2 M of pyrogallol, 1% to 20% by weight of the polyethylene imine, 0.001% to 0.1% by weight of silica particles, and a remainder of water. The silica particles may promote a cross-linking reaction, and may provide oxygen to pyrogallol to increase a curing speed. In another example embodiment, the adhesive may include 0.01 M to 0.2 M of pyrogallol, 10% to 20% by weight of the polyethylene imine, 0.001% to 0.1% by weight of silica particles, and a remainder of water.

When the amount of the pyrogallol is excessively high, a cross-linking degree may excessively increase so that it may be difficult to remove the adhesive. When the amount of the pyrogallol is excessively low, an adhesive force may be reduced.

A weight average molecular weight of the polyethylene imine may be, for example, about 25,000 to about 750,000.

According to example embodiment, the adhesive includes a material such as a tannic acid, a catecholamine compound, or the like, which may form a strong hydrogen bond. Thus, the adhesive may provide a strong adhesive force to various substrates. Furthermore, a binding element may be entangled by cross-linking, such that the adhesive may be partially dissolved or gelled by a solvent such as water after being cured. Thus, the adhesive may be easily removed, and may be removed by, for example, laser or plasma.

Furthermore, the adhesive may be an aqueous type without an organic solvent, which may, for example, reduce an amount of outgassing.

Pellicle and Method for Manufacturing a Pellicle

Figure 2:
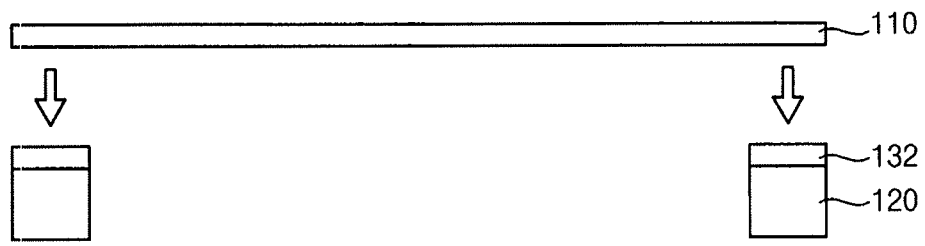
FIG. 2 is a cross-sectional view illustrating a method for manufacturing a pellicle according to an example embodiment.

FIG. 1 is a cross-sectional view illustrating a pellicle according to an example embodiment. FIG. 2 is a cross-sectional view illustrating a method for manufacturing a pellicle according to an example embodiment.

Referring to FIG. 1, a pellicle 100 may be combined with a photo mask 200.

The pellicle 100 may protect the photo mask 200 from impurities such as dust. A pattern, which corresponds to an object such as a photoresist to be patterned, may be formed on a surface of the photo mask 200.

In the example embodiment illustrated in FIG. 1, the pellicle 100 includes a pellicle membrane 110, and a frame 120 supporting the pellicle membrane 110 and combined with the photo mask 200. A membrane adhesive layer 130 is provided between the pellicle membrane 110 and the frame 120 to combine the pellicle membrane 110 with the frame 120.

A mask assembly including the pellicle 100 and the photo mask 200 combined therewith may be referred as a reticle 10.

The reticle 10 may be used for a photolithography process. For example, a light emitted by a light source may be provided to the photo mask 200 through the pellicle membrane 110. In an example embodiment, the reticle 10 may be used for an extreme ultraviolet radiation (EUV) lithography process using a light source emitting a light having a wavelength of about 13.5 nm. The reticle 10 may be, for example, a reflective reticle or a transparent reticle.

The pellicle membrane 110 may be spaced apart from the photo mask 200, and may have a thin film shape. The pellicle membrane 110 may have a high light transmittance for a light emitted by a light source. For example, the pellicle membrane 110 may have a light transmittance equal to or more than about 80% for an EUV, for example, a light transmittance equal to or more than about 90% for an EUV. The pellicle membrane 110 may include various materials having a high light transmittance for a light, for example, EUV, emitted by a light source.

In an example embodiment, the pellicle membrane 110 may include silicon. For example, the pellicle membrane 110 may include polysilicon, single crystalline silicon, silicon nitride, or a combination thereof.

In an example embodiment, the pellicle membrane 110 may include a carbon-based material. For example, the pellicle membrane 110 may include amorphous carbon, graphene, nanometer-thickness graphite, carbon nanosheet, carbon nanotube, silicon carbide (SiC), boron carbide ($B_4C$) or a combination thereof. For example, the pellicle membrane 110 may include nanocrystalline graphene. The nanocrystalline graphene may include a plurality of crystal grains. The crystal grains may include a two-dimensional carbon structure having an aromatic ring shape. A size (a length or a diameter) of the crystal grain may be equal to or less than hundreds of nm, for example, about 100 nm. The two-dimensional carbon structure may have a layered structure wherein carbon atoms are two-dimensionally arranged. The crystal grain may include a defect. For example, the defect may include at least one of an sp3 carbon atom, a hydrogen atom, an oxygen atom, a nitrogen atom and a carbon vacancy.

In an example embodiment, the pellicle membrane 110 may include a semiconductive material having a two-dimensional crystalline structure. For example, the pellicle membrane 110 may include a transition metal dichalcogenide. For example, the transition metal dichalcogenide may include at least one metal element of molybdenum (Mo), tungsten (W), niobium (Nb), vanadium (V), tantalum (Ta), titanium (Ti), zirconium (Zr), hafnium (Hf), technetium (Tc), rhenium (Re), copper (Cu), gallium (Ga), indium (In), germanium (Ge) and lead (Pb), and at least one chalcogen element of sulfur (S), selenium (Se), or tellurium (Te).

In an example embodiment, the pellicle membrane 110 may include a fluorine-containing polymer.

In an example embodiment, the pellicle membrane 110 may have a single-layered structure or a multiple-layered structure. For example, the pellicle membrane 110 may have a multiple-layered structure including a combination of the above-mentioned materials. For example, the pellicle membrane 110 may further include a protective layer combined with a surface or both surfaces of a membrane layer and including SiC, $SiO_2$, $Si_3N_4$, SiON, $Y_2O_3$, YN, Mo, Ru, Rh, BN, $B_4C$, B, or a combination thereof.

In an example embodiment, a thickness of the pellicle membrane 110 may be equal to or less than about 200 nm, for example, may be about 1 nm to about 100 nm.

The frame 120 may be disposed along an edge of the photo mask 200 to support the pellicle membrane 110 so that the pellicle membrane 110 may be spaced apart from the photo mask 200 by a uniform distance. For example, the pellicle membrane 110 may be spaced apart from the photo mask 200 by a distance of about 1 mm to about 10 mm. The frame 120 may have, for example, a circular shape or a rectangular shape in a plan view to correspond to a shape of the photo mask 200.

In an example embodiment, the frame 120 may include a metal having a high heat radiation property and a high strength. For example, the frame 120 may include aluminum, anodic aluminum oxide, stainless steel (SUS), aluminum treated with diamond-like carbon (DLC), SUS treated with DLC, silicon, or a combination thereof.

The membrane adhesive layer 130 may be formed from an adhesive for a pellicle according to an embodiment as described above.

For example, the adhesive may be provided between the frame 120 and the pellicle membrane 110, and dried to form the membrane adhesive layer 130. In an example embodiment, as illustrated in FIG. 2, the adhesive is coated on a surface of the frame 120 to form a coating layer 132. Thereafter, the pellicle membrane 110 is brought into contact with the coating layer 132. While the pellicle membrane 110 contacts the coating layer 132, the coating layer 132 is dried for a predetermined time to form the cured membrane adhesive layer 130.

In an example embodiment, the coating layer 132 may be dried at a temperature equal to or less than about 100° C., for example, at a temperature of about 60° C. to about 90° C.

The membrane adhesive layer 130 may include a cross-linked structure formed from a phenol compound having at least two hydroxyl groups and a polymer having a hydroxyl group or an amine group.

In an example embodiment, the membrane adhesive layer 130 may include a cross-linked structure of polyvinylalcohol and at least one of gallic acid, glucogallin, di-galloylglucose, tri-galloylglucose, tetra-galloylglucose, m-trigallic acid, tannic acid, or ellagic acid.

In an example embodiment, the membrane adhesive layer 130 may include a cross-linked structure of a catecholamine compound formed by reaction of pyrogallol and polyethylene imine.

The membrane adhesive layer 130 may have a bond strength equal to or more than about 7 kgf/cm$^2$. For example, the membrane adhesive layer 130 may have a bond strength about 7 kgf/cm$^2$ to about 20 kgf/cm$^2$. Furthermore, the membrane adhesive layer 130 may have a toughness equal to or more than about 195 gf. The membrane adhesive layer 130 may include tannic acid or catecholamine, which has an aromatic carbon ring structure. Thus, the membrane adhesive layer 130 may have a large adhesive force to a carbon-based membrane.

Furthermore, the membrane adhesive layer 130 may be formed without an organic solvent. Thus, an outgassing amount may be small. Furthermore, the membrane adhesive layer 130 may be formed from an aqueous adhesive cured by a hydrogen bond. Thus, the membrane adhesive layer 130 may be easily removed and may be environment-friendly.

Figure 3:
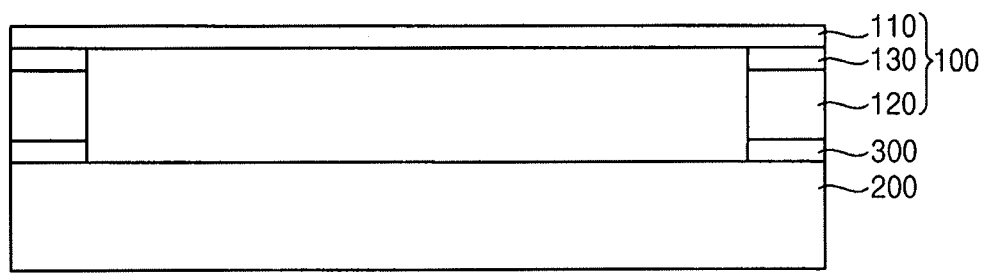
FIG. 3 is a cross-sectional view illustrating a pellicle according to an example embodiment.

FIG. 3 is a cross-sectional view illustrating a pellicle according to an example embodiment.

Referring to FIG. 3, the pellicle 100 may be combined with the photo mask 200.

The pellicle 100 includes the pellicle membrane 110 and the frame 120 supporting the pellicle membrane 110 and combined with the photo mask 200. A membrane adhesive layer 130 is provided between the pellicle membrane 110 and the frame 120 to combine the pellicle membrane 110 with the frame 120.

The mask assembly including the pellicle 100 and the photo mask 200 combined therewith may be referred as the reticle 20.

The pellicle 100 and the photo mask 200 may be combined with each other by a mask adhesive layer 300 disposed between the frame 120 and the photo mask 200.

The mask adhesive layer 300 may be formed from an adhesive substantially the same as that of the membrane adhesive layer 130. For example, the adhesive may be coated on a lower surface of the frame 120, and may be combined with the photo mask 200.

The following Example is provided in order to highlight characteristics of one or more embodiments but it will be understood that embodiments are not limited to the particular details described in the Example.

Example 20 g of water and 20 g of polyvinylalcohol having a weight average molecular weight of 9,000 were mixed together at a room temperature to form a polyvinylalcohol solution. 20 g of water and 3.4 g of tannic acid powder were mixed together at a room temperature to form a tannic acid solution.

5 ml of the polyvinylalcohol solution and 5 ml of the tannic acid solution were mixed with each other to prepare 10 ml of an adhesive.

0.0002 g of the adhesive was provided between an aluminum stud and an aluminum plate (7 mm×7 mm×2 mm) and air dried for about two hours.

The bond strength and the toughness of the sample were 8.25 kgf/cm$^2$ and 195 gf(N). Thus, the sample demonstrated suitability for use as an adhesive for a pellicle.

By way of summation and review, a pellicle may include a pellicle membrane and a frame supporting the pellicle membrane. An adhesive may be used for combining the pellicle membrane with the frame, and for combining the frame with the photo mask. A general adhesive may not be easily removed and/or may have a small adhesive force to a carbon-based membrane such as graphite.

As described above, embodiments may provide an adhesive for a pellicle, a pellicle bonded by the adhesive, and a method for manufacturing a pellicle, which may be used in a photolithography process for manufacturing an electronic device such as a semiconductor device. An adhesive for a pellicle according to an example embodiment may have a large adhesive force and may be easily removable.

According to an example embodiment, an adhesive for a pellicle may include a phenol compound having at least two hydroxyl groups, and a polymer having a hydroxyl group or an amine group. The hydroxyl groups of the phenol compound may react with the hydroxyl group or the amine group of the polymer such that the phenol compound functions as a cross-linker. The adhesive may be hardened by drying or the like.

According to an example embodiment, an adhesive for a pellicle may include a material such as a tannic acid, a catecholamine compound, or the like, which may form a strong hydrogen bond. Thus, the adhesive may provide a strong adhesive force to various substrates. Furthermore, a binding element of the adhesive may be entangled by cross-linking. Thus, the adhesive may be partially dissolved or gelling by a solvent such as water after being cured. Thus, the adhesive may be easily removed, and may be removed by, for example, laser or plasma. Furthermore, the adhesive may be formed as an aqueous type without an organic solvent, which may significantly reduce outgassing.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a photo mask assembly, the method comprising:
   combining a frame with a pellicle membrane by providing an adhesive between the frame and the pellicle membrane;
   heating the adhesive at a temperature of about 60° C. to about 90° C. to form an adhesive layer; and
   combining the frame with a photo mask,
   wherein the adhesive consists of about 0.01 M to about 0.2 M of pyrogallol, about 1% to about 20% by weight of polyethylene imine having weight average molecular weight of about 25,000 to about 750,000, about 0.001% to about 0.1% by weight of silica particles, and a remainder of water,
   wherein the pellicle membrane includes one or more of silicon, a carbon material, a semiconductive material, or a fluorine-containing polymer,
   wherein the frame includes a metal, and
   wherein the adhesive layer formed from the adhesive has a bond strength about 7 kgf/cm$^2$ to about 20 kgf/cm$^2$.

2. The method as claimed in claim 1,
   wherein the carbon material includes one or more of amorphous carbon, graphene, nanometer-thickness graphite, carbon nanosheet, carbon nanotube, SiC, or B4C.

3. The method as claimed in claim 1,
   wherein the pellicle membrane has a light transmittance equal to or more than about 80% for extreme ultraviolet radiation (EUV).

4. The method as claimed in claim 1,
   wherein the adhesive layer has a toughness equal to or more than about 195 gf.

5. The method as claimed in claim 1,
   wherein the frame includes one or more of aluminum, anodic aluminum oxide, stainless steel (SUS), aluminum treated with diamond-like carbon (DLC), SUS treated with DLC, or silicon.

6. A method of fabricating a photo mask assembly, the method comprising:
   combining a frame with a pellicle membrane by providing an adhesive between the frame and the pellicle membrane;
   heating the adhesive at temperature of about 60° C. to about 90° C. to form an adhesive layer, wherein the adhesive layer contacts the pellicle membrane and the frame; and
   combining the frame with a photo mask,
   wherein the adhesive consists of about 1% to about 30% by weight of tannic acid, about 20% to about 40% by weight of polyvinylalcohol, about 0.05% to about 1% by weight of silica particles, and a remainder of water without either an additional curing agent or an additional cross-linking agent, wherein the pellicle membrane includes one or more of silicon, a carbon material, a semiconductive material, or a fluorine-containing polymer, wherein the frame includes a metal, wherein the adhesive layer formed from the adhesive has a bond strength about 7 kgf/cm² to about 20 kgf/cm², and wherein the adhesive layer has a cross-linked structure formed by hydrogen bonds between the tannic acid and the polyvinylalcohol such that the adhesive layer is soluble by solvent.

7. The method as claimed in claim 6,
wherein the carbon material includes one or more of amorphous carbon, graphene, nanometer-thickness graphite, carbon nanosheet, carbon nanotube, SiC, or B4C.

8. The method as claimed in claim 6,
wherein the pellicle membrane has a light transmittance equal to or more than about 80% for extreme ultraviolet radiation (EUV).

9. The method as claimed in claim 6,
wherein the adhesive layer has a toughness equal to or more than about 195 gf.

10. The method as claimed in claim 6,
wherein the frame includes one or more of aluminum, anodic aluminum oxide, stainless steel (SUS), aluminum treated with diamond-like carbon (DLC), SUS treated with DLC, or silicon.

11. A method of manufacturing a semiconductor device, the method comprising:
providing a light to a photo mask assembly including a photo mask, a pellicle membrane, a frame disposed between the photo mask and the pellicle membrane and an adhesive layer combining the frame with the pellicle membrane, wherein the adhesive layer is formed from an adhesive consisting of about 1% to about 30% by weight of tannic acid, about 20% to about 40% by weight of polyvinylalcohol, about 0.05% to about 1% by weight of silica particles, and a remainder of water without either an additional curing agent or an additional cross-linking agent, wherein the forming of the adhesive layer is performed by heating the adhesive at a temperature of about 60° C. to about 90° C., wherein the pellicle membrane includes one or more of silicon, a carbon material, a semiconductive material, or a fluorine-containing polymer, wherein the frame includes a metal, and wherein the adhesive layer has a bond strength about 7 kgf/cm² to about 20 kgf/cm².

12. The method as claimed in claim 11,
wherein the carbon material includes one or more of amorphous carbon, graphene, nanometer-thickness graphite, carbon nanosheet, carbon nanotube, SiC, or B4C.

13. The method as claimed in claim 11,
wherein the pellicle membrane has a light transmittance equal to or more than about 80% for extreme ultraviolet radiation (EUV).

14. The method as claimed in claim 11,
wherein the adhesive layer has a toughness equal to or more than about 195 gf.

15. The method as claimed in claim 11,
wherein the frame includes one or more of aluminum, anodic aluminum oxide, stainless steel (SUS), aluminum treated with diamond-like carbon (DLC), SUS treated with DLC, or silicon.

16. The method as claimed in claim 11,
wherein the light is EUV.

17. The method as claimed in claim 11,
wherein the light has a wavelength of about 13.5 nm.

18. The method as claimed in claim 11,
wherein the light is irradiated onto the photo mask through the pellicle membrane.

* * * * *